United States Patent
Lim

(10) Patent No.: US 8,213,237 B2
(45) Date of Patent: Jul. 3, 2012

(54) CHARGE PUMP AND SEMICONDUCTOR DEVICE HAVING THE SAME

(75) Inventor: Ji-Hoon Lim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 221 days.

(21) Appl. No.: 12/786,734

(22) Filed: May 25, 2010

(65) Prior Publication Data

US 2010/0329067 A1   Dec. 30, 2010

(30) Foreign Application Priority Data

Jun. 24, 2009  (KR) .................. 10-2009-0056612

(51) Int. Cl.
*G11C 11/34* (2006.01)
(52) U.S. Cl. .............. 365/185.25; 365/203; 365/204; 365/189.09; 365/149
(58) Field of Classification Search .......... 365/185.25, 365/203, 204, 189.09, 149
See application file for complete search history.

(56) References Cited

U.S. PATENT DOCUMENTS 6,989,698 B2    1/2006  Jeong
2002/0191447 A1*  12/2002  Kondo et al. ............ 365/189.09

FOREIGN PATENT DOCUMENTS

| JP | 11339463 A | 12/1999 |
|---|---|---|
| KR | 1020030042064 A | 5/2003 |
| KR | 1020040019604 A | 3/2004 |

* cited by examiner

*Primary Examiner* — Jason Lappas
(74) *Attorney, Agent, or Firm* — Volentine & Whitt, PLLC

(57) ABSTRACT

A charge pump and method of operation are provided. The charge pump includes a first boosting unit configured to receive a pre-charge voltage and electrically charge a first MOS capacitor during a pre-charge period, and to boost a voltage of a connection node to a first output voltage during a boosting operation period, and a second boosting unit configured to receive the pre-charge voltage and electrically charge a second MOS capacitor during the pre-charge period, and to receive the first output voltage and boost a voltage of an output node to a second output voltage during the boosting operation period. Here, the pre-charge voltage is applied to electrically charge a parasitic capacitor during a parasitic capacitor charging period between the pre-charge period and the boosting operation period.

20 Claims, 7 Drawing Sheets

CHARGE PUMP AND SEMICONDUCTOR DEVICE HAVING THE SAME

PRIORITY STATEMENT

This application claims priority under 35 U.S.C. §119 to Korean Patent Application No. 10-2009-0056612 filed on Jun. 24, 2009, the subject matter of which is hereby incorporated by reference.

BACKGROUND

The subject inventive concept relates to charge pumps capable of generating a boosted output voltage using a metal-oxide-semiconductor (MOS) capacitor. More particularly, the inventive concept relates to a charge pump capable of preemptively charging a parasitic capacitor within a charge pump to prevent an output voltage and/or output current from being reduced due to the parasitic capacitor. Such charge pumps will find application in various types of semiconductor devices.

It is often the case in conventional semiconductor devices that when a charge pump is configured "on chip" using a MOS capacitor, a charge-sharing phenomenon occurs between a junction capacitor and parasitic capacitors that exist between a body of a capacitor of a next node connected to a pumping capacitor and a substrate. This phenomenon tends to undesirably reduce the level of the output voltage and/or current (hereafter "output voltage/current") provided by the charge pump.

Therefore, when a charge pump is configured on chip using a MOS capacitor, some means should be provided to compensate for this reduction of output voltage/current caused by a parasitic capacitor.

SUMMARY

Example embodiments of the inventive concept provide a charge pump capable of preventing the reduction of output voltage/current due to a parasitic capacitor.

Example embodiments also provide a semiconductor device incorporating a charge pump capable of preventing the output voltage/current from being reduced due to a parasitic capacitor.

Example embodiments are directed to a charge pump including: a first boosting unit configured to receive a pre-charge voltage and electrically charge a first MOS capacitor during a pre-charge period, and to boost a voltage of a connection node to a first output voltage during a boosting operation period; and a second boosting unit configured to receive the pre-charge voltage and electrically charge a second MOS capacitor during the pre-charge period, and to receive the first output voltage and boost a voltage of an output node to a second output voltage during the boosting operation period. Here, the pre-charge voltage is applied to electrically charge a parasitic capacitor during a parasitic capacitor charging period between the pre-charge period and the boosting operation period.

In example embodiments, the first boosting unit may include: the first MOS capacitor connected between a first node and a second node; a power boost switch connected between the pre-charge voltage and the first node and turned ON during the boosting operation period; a first high switch connected between the pre-charge voltage and the second node and turned ON during the pre-charge period; a first low switch connected between the first node and a ground voltage and turned ON during the pre-charge period; and a first output switch connected between the second node and the connection node and turned ON during the boosting operation period.

In example embodiments the second boosting unit may include: the second MOS capacitor connected between the connection node and a third node; a second high switch connected between the pre-charge voltage and the third node and turned ON during the pre-charge period; a second low switch connected between the connection node and a ground voltage and turned ON during the pre-charge period; and a second output switch connected between the third node and the output node and turned ON during the boosting operation period.

In example embodiments, the charge pump may further include a parasitic capacitor charging switch disposed between the pre-charge voltage and the connection node and turned ON during the parasitic capacitor charging period to apply the pre-charge voltage to the parasitic capacitor to electrically charge the parasitic capacitor.

In example embodiments, the first high switch and the first output switch may be turned ON during the parasitic capacitor charging period to apply the pre-charge voltage to the parasitic capacitor and electrically charge the parasitic capacitor.

In example embodiments, the first output voltage may be a voltage in which a voltage charged in the first MOS capacitor is added to the pre-charge voltage, and the second output voltage may be a voltage in which a voltage charged in the second MOS capacitor is added to the first output voltage.

In example embodiments, the parasitic capacitor may be a junction parasitic capacitor existing between a well of the MOS capacitor and a substrate.

Other example embodiments are directed to a semiconductor device including a charge pump. The charge pump includes: a first boosting unit configured to receive a pre-charge voltage and electrically charge a first MOS capacitor during a pre-charge period, and to boost a voltage of a connection node to a first output voltage during a boosting operation period; and a second boosting unit configured to receive the pre-charge voltage and electrically charge a second MOS capacitor during the pre-charge period, and to receive the first output voltage and boost a voltage of an output node to a second output voltage during the boosting operation period. Here, the pre-charge voltage is applied to electrically charge a parasitic capacitor during a parasitic capacitor charging period between the pre-charge period and the boosting operation period.

In example embodiments, the semiconductor device may further include: a word line driver configured to receive the second output voltage and drive a word line; and a memory cell array including a memory cell array block having a memory cell connected between the word line and a bit line.

Other example embodiments are directed to a method of operating a charge pump disposed in a semiconductor device, the charge pump comprising a first boosting unit, a second boosting unit, and the method including; receiving a pre-charge voltage in the first boosting unit and electrically charging a first MOS capacitor during a pre-charge period, by operation of the first boosting unit, boosting a voltage of a connection node to a first output voltage during a boosting operation period, receiving the pre-charge voltage in the second boosting unit and electrically charging a second MOS capacitor during the pre-charge period, receiving in the second boosting unit the first output voltage and boosting a voltage of an output node to a second output voltage during the boosting operation period, wherein the pre-charge voltage is applied to a parasitic capacitor to electrically charge the parasitic capacitor during a parasitic capacitor charging period between the pre-charge period and the boosting operation period.

BRIEF DESCRIPTION OF THE DRAWINGS

Certain example embodiments will now be described in some additional detail with reference to the accompanying drawings. It should be understood that various aspects of the drawings may have been exaggerated for clarity.

DETAILED DESCRIPTION OF THE EMBODIMENTS

Figure 1:
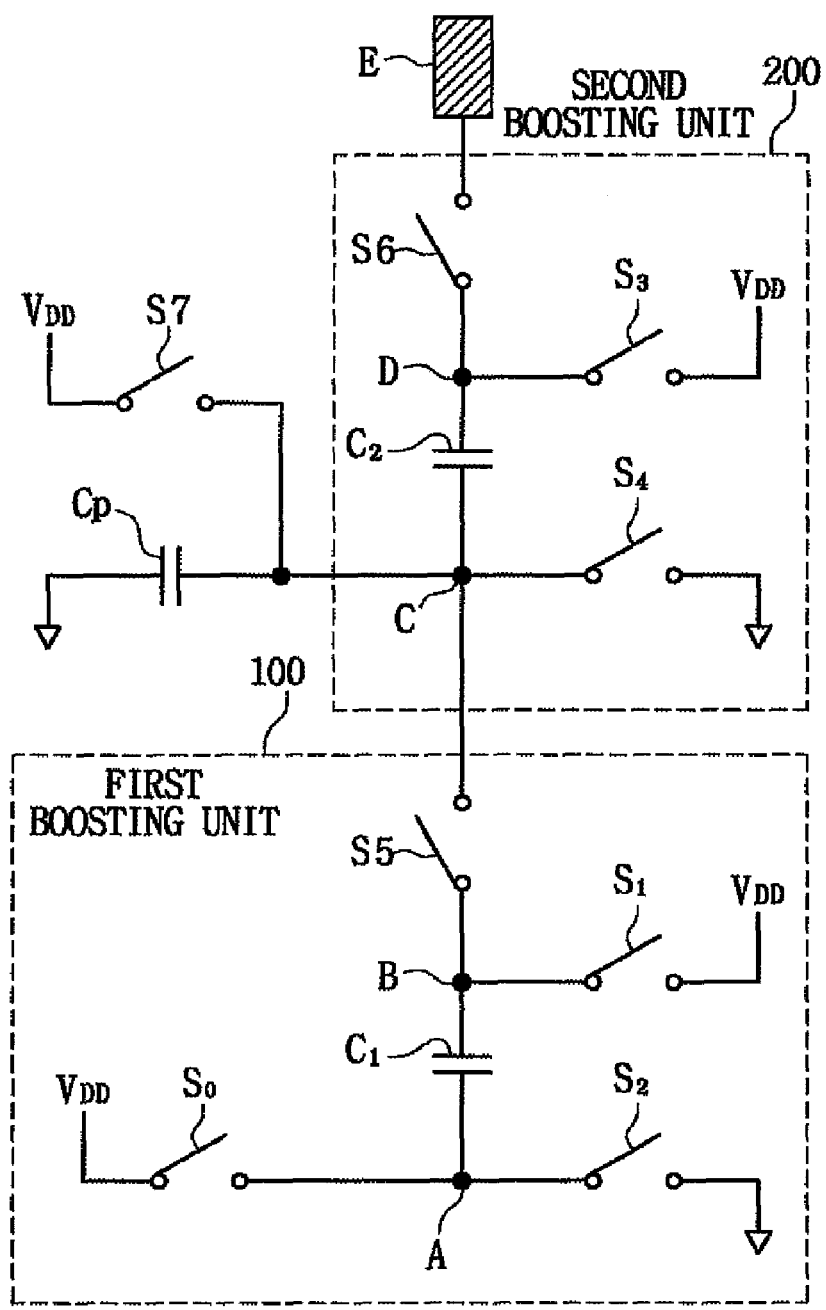
FIG. 1 illustrates a configuration of a charge pump circuit capable of electrically charging a parasitic capacitor according to an example embodiment.

Various example embodiments will now be described in some additional detail with reference to the accompanying drawings. However, specific structural and functional details disclosed herein are merely representative for purposes of describing example embodiments. This inventive concept may be embodied in many alternate forms and should not be construed as being limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the inventive concept. Throughput the written description and drawings like numbers refer to like or similar elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the inventive concept is not limited to example embodiments described.

Figure (FIG.) 1 illustrates a configuration of a charge pump circuit which can electrically charge a parasitic capacitor according to an example embodiment. For convenience of description, a pre-charge voltage is denoted as "VDD".

A charge pump according to an example embodiment may include a first boosting unit 100, a second boosting unit 200, and a parasitic capacitor charging switch S7. In FIG. 1, Cp denotes a parasitic capacitor.

The first boosting unit 100 may include a first MOS capacitor $C_1$ connected between a first node A and a second node B, a power boost switch $S_0$ connected between the pre-charge voltage VDD and the first node A, a first high switch $S_1$ connected between the pre-charge voltage VDD and the second node B, a first low switch $S_2$ connected between the first node A and a ground voltage, and a first output switch $S_5$ connected between the second node B and a connection node C.

The second boosting unit 200 may be configured to include a second MOS capacitor $C_2$ connected between the connection node C and a third node D, a second high switch $S_3$ connected between the pre-charge voltage VDD and the third node D, a second low switch $S_4$ connected between the connection node C and the ground voltage, and a second output switch $S_6$ connected between the third node D and an output node E.

The parasitic capacitor Cp is between the second MOS capacitor $C_2$ and a semiconductor substrate, and the parasitic capacitor charging switch $S_7$ is connected between the pre-charge voltage VDD and the connection node C.

Functional operation of the exemplary charge pump circuit illustrated in FIG. 1 will now be described.

During a pre-charge period, the first boosting unit 100 and the second boosting unit 200 receive the pre-charge voltage VDD and electrically charge the first MOS capacitor $C_1$ and the second MOS capacitor $C_2$, respectively. That is, during the pre-charge period, the first high switch $S_1$ and the first low switch $S_2$ of the first boosting unit 100 are turned ON, and the power boost switch $S_0$ and the first output switch $S_5$ are turned OFF, so that the first MOS capacitor $C_1$ is electrically charged by the pre-charge voltage VDD applied through the first high switch $S_1$. Further, during the pre-charge period, the second high switch $S_3$ and the second low switch $S_4$ of the second boosting unit 200 are turned ON, and the second output switch $S_6$ is turned OFF, so that the second MOS capacitor $C_2$ is electrically charged by the pre-charge voltage VDD applied through the second high switch $S_3$.

During a parasitic capacitor charging period, the parasitic capacitor charging switch S7 is turned ON. That is, the pre-charge voltage VDD is applied to the parasitic capacitor Cp through the parasitic capacitor charging switch $S_7$, so that the parasitic capacitor Cp is electrically charged by the pre-charge voltage VDD. The parasitic capacitor charging switch $S_7$ is turned OFF during the pre-charge period and a boosting operation period.

During the boosting operation period, the first boosting unit 100 boosts a voltage of the connection node C to a first output voltage, and the second boosting unit 200 boosts a voltage of the output voltage E to a second output voltage. That is, the first high switch $S_1$ and the first low switch $S_2$ of the first boosting unit 100 are turned OFF, and the power boost switch $S_0$ and the first output switch $S_5$ are turned ON, so that the voltage of the connection node C is boosted to the first output voltage (e.g., 2*VDD) by the pre-charge voltage VDD applied through the power boost switch $S_0$ and the voltage charged in the first MOS capacitor $C_1$. Further, the second high switch $S_3$ and the second low switch $S_4$ of the second boosting unit 200 are turned OFF, and the second output switch $S_6$ is turned ON, so that the voltage of the output node E is boosted to the second output voltage (e.g., 3*VDD) by the first output voltage (e.g., 2*VDD) applied through the connection node C and the voltage charged in the second MOS capacitor $C_2$.

A charge pump according to one possible embodiment of the inventive concept has been described as comprising the first boosting unit 100, the second boosting unit 200, and the parasitic capacitor charging switch S7 and outputting the output voltage to the output node E. However, a third, a fourth, or even higher boosting unit(s) may be disposed between the second boosting unit 200 and the output node E. In such cases, the charge pump may further include parasitic capacitor charging switches for electrically charging parasitic capacitors which occur between the second boosting unit and the third boosting unit and between the third boosting unit and the fourth boosting unit.

Figure 2:
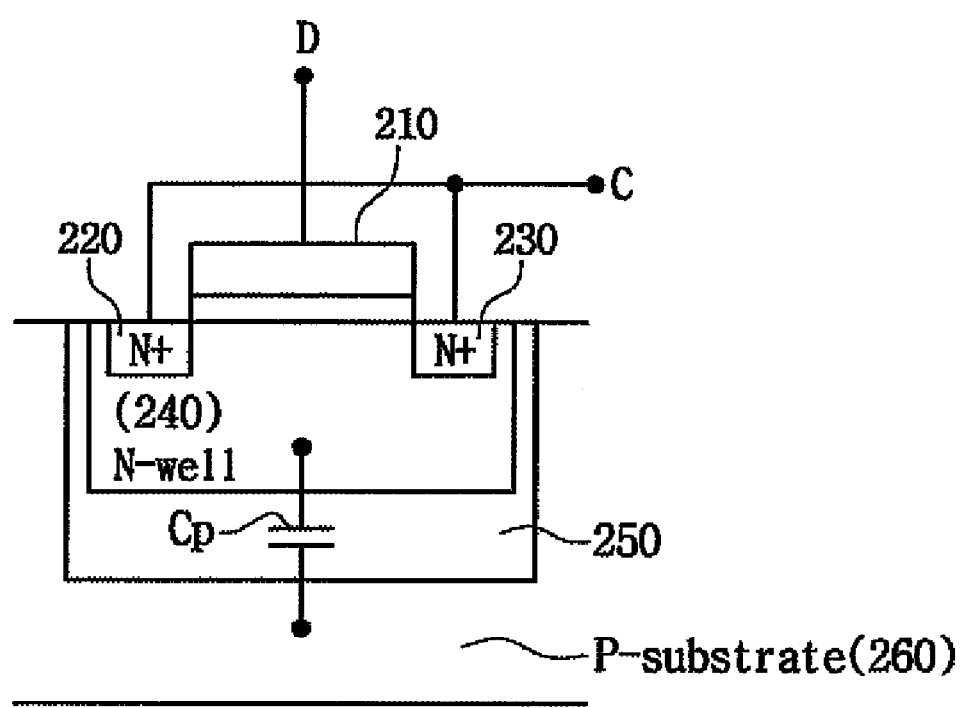
FIG. 2 illustrates a MOS capacitor structure of a charge pump and a parasitic capacitor according to an example embodiment.

FIG. 2 illustrates a MOS capacitor structure of a charge pump and a parasitic capacitor according to an example embodiment.

The first MOS capacitor C1 and the second MOS capacitor of the charge pump according to an example embodiment are configured with a MOS capacitor illustrated in FIG. 2.

A MOS capacitor according to an example embodiment may be configured with a MOS transistor formed in an N well 240. A gate 210 of the MOS capacitor is connected to a third node D, and a source 220 and a drain 230 are connected to the connection node C. A junction parasitic capacitor Cp exists in a depletion region between the N well 240 of the MOS capacitor and a P-type substrate 260. An N-type MOS capacitor is illustrated in FIG. 2, but a charge pump according to an example embodiment may be implemented by using a P-type MOS capacitor. In this case, a junction parasitic capacitor may exist between a P well of the MOS capacitor and an N-type substrate.

Figure 3:
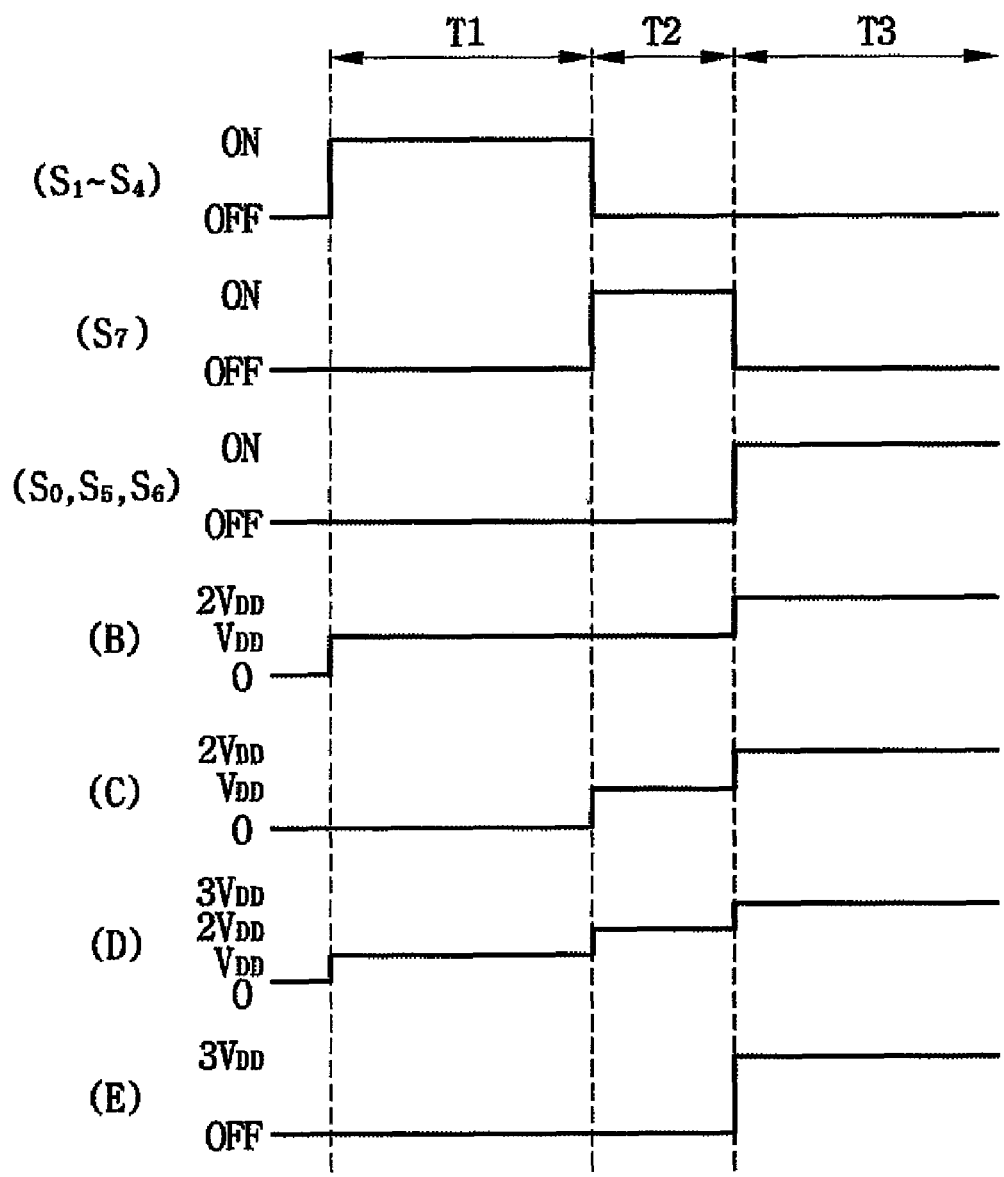
FIG. 3 is a timing diagram for explaining an operation of a charge pump using a parasitic capacitor charging switch according to an example embodiment.

FIG. 3 is a timing diagram further illustrating one possible operation for a charge pump using a parasitic capacitor charging switch according to an embodiment of the inventive concept.

As illustrated in FIG. 3, $S_0$ to $S_7$ represent ON/OFF operation timings for the power boost switch $S_0$, the first high switch $S_1$, the first low switch $S_2$, the second high switch $S_3$, the second low switch $S_4$, the first output switch $S_5$, the second output switch $S_6$, and the parasitic capacitor charging switch $S_7$, respectively. Further, C represents a voltage change of the connection node, D represents a voltage change of the third node, and E represents a voltage change of the output node. $T_1$, $T_2$, and $T_3$ represent the pre-charge period, the parasitic capacitor charging period, and the boosting operation period, respectively. The parasitic capacitor charging period $T_2$ may be shorter than the pre-charge period $T_1$ and the boosting operation period $T_3$.

One possible operation for the charge pump illustrated in FIG. 1 will now be described with reference to FIG. 3.

During the pre-charge period $T_1$, the first high switch $S_1$ and the first low switch $S_2$ are turned ON, and the power boost switch $S_0$ and the first output switch $S_5$ are turned OFF. Thus, the first MOS capacitor $C_1$ is electrically charged to the pre-charge voltage VDD applied through the first high switch $S_1$. Further, during the pre-charge period $T_1$, the second high switch $S_3$ and the second low switch $S_4$ are turned ON, and the second output switch $S_6$ is turned OFF. Thus, the second MOS capacitor $C_2$ is electrically charged to the pre-charge voltage VDD applied through the second high switch $S_3$. A voltage level of the third node D becomes the pre-charge voltage level (for example, VDD) since the pre-charge voltage VDD is applied through the second high switch $S_3$.

During the parasitic capacitor charging period $T_2$, the parasitic capacitor charging switch $S_7$ is turned ON, and the first high switch $S_1$, the first low switch $S_2$, the second high switch $S_3$, the second low switch $S_4$, the first output switch $S_5$, the second output switch $S_6$, and the power boost switch $S_0$ are turned OFF. Thus, the parasitic capacitor Cp is electrically charged to the pre-charge voltage VDD applied through the parasitic capacitor charging switch $S_7$. A voltage level of the connection node C becomes the pre-charge voltage VDD since the power voltage is applied. A voltage level of the third node D becomes a level (2*VDD) which is approximately twice as high as the pre-charge voltage by the pre-charge voltage VDD applied through the parasitic capacitor charging switch $S_7$ and the voltage charged in the second MOS capacitor $C_2$.

During the boosting operation period $T_3$, the power boost switch $S_0$, the first output switch $S_5$, and the second output switch $S_6$ are turned ON, and the first high switch $S_1$, the first low switch $S_2$, the second high switch $S_3$, and the second low switch $S_4$ are turned OFF. Thus, during the boosting operation period, the connection node C is boosted to the first output voltage (e.g., 2*VDD) by the pre-charge voltage VDD applied through the power boost switch $S_0$ and the voltage charged in the first MOS capacitor $C_1$. Further, the third node D and the output node E are boosted to the second output voltage (e.g., 3*VDD) by the first output voltage applied through the first output switch $S_5$ and the voltage charged in the second MOS capacitor $C_2$.

In FIG. 3, during the parasitic capacitor pre-charge period $T_2$, the first high switch $S_1$, the first low switch $S_2$, and the second high switch $S_3$ may be turned ON.

Figure 4:
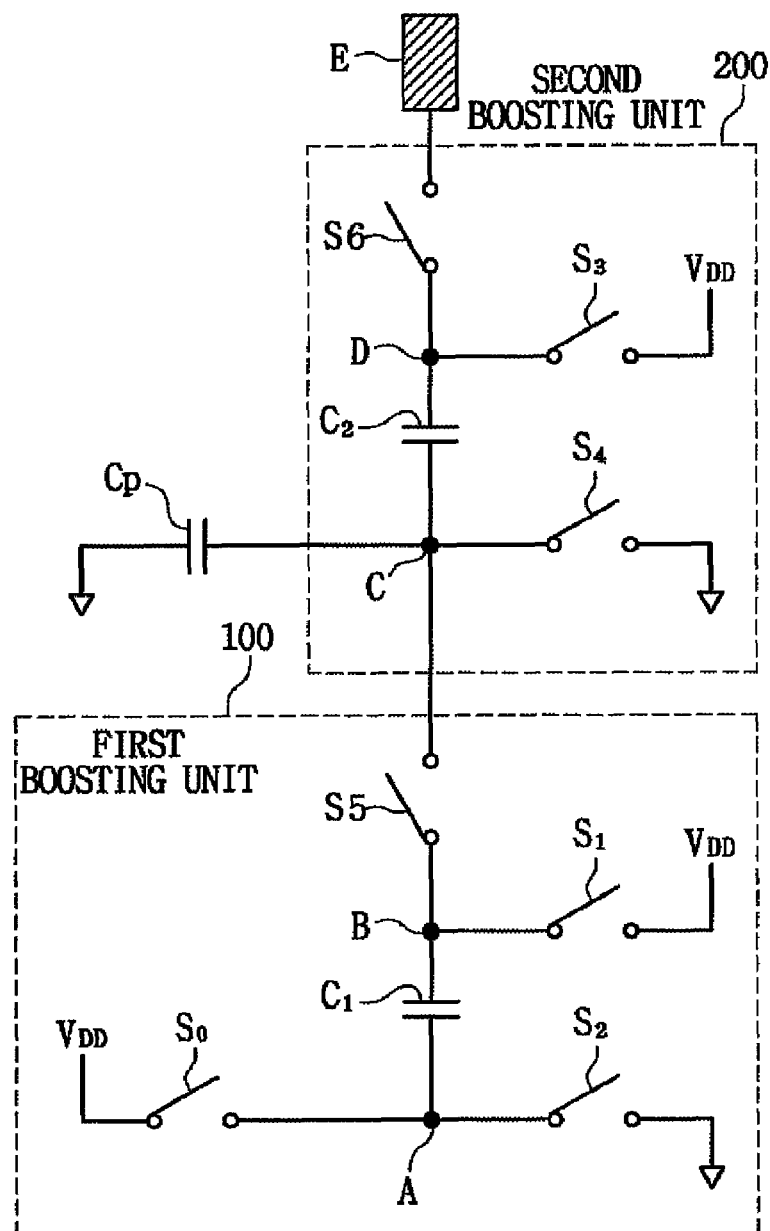
FIG. 4 illustrates another configuration of a charge pump circuit which can electrically charge a parasitic capacitor according to an example embodiment.

FIG. 4 illustrates another configuration of a charge pump circuit capable of electrically charging a parasitic capacitor according to an example embodiment of the inventive concept.

The charge pump of FIG. 4 may be configured to include a first boosting unit 100 and a second boosting unit 200. Here again, Cp denotes a parasitic capacitor.

The circuit configuration of FIG. 4 differs from the circuit configuration of FIG. 1 only in that the parasitic capacitor charging switch $S_7$ of FIG. 1 is omitted. As a result, in the circuit configuration of FIG. 4, a first high switch $S_1$ and a first output switch $S_5$ function as the parasitic capacitor charging switch $S_7$ during a parasitic capacitor charging period $T_2$.

The circuit configuration of FIG. 4 performs the same operation as the circuit configuration of FIG. 1 during the pre-charge period $T_1$ and the boosting operation period $T_3$ but a different operation during the parasitic capacitor charging period $T_2$. Thus, the following description will be made focusing on the parasitic charging period $T_2$.

During the parasitic capacitor charging period $T_2$, the first boosting unit 100 electrically charges the parasitic capacitor Cp through the first high switch $S_1$ and the first output switch $S_5$. That is, during the parasitic capacitor charging period $T_2$, the first high switch $S_1$ and the first output switch $S_5$ are turned ON. Thus, the pre-charge voltage VDD is applied to the parasitic capacitor Cp through the first high switch $S_1$ and the first output switch $S_5$, charging the parasitic capacitor Cp. In the circuit configuration of FIG. 4, during the parasitic capacitor charging period $T_2$, since the pre-charge voltage VDD is applied to the connection node C, the voltage level of the connection node C becomes the pre-charge voltage level.

Figure 5:
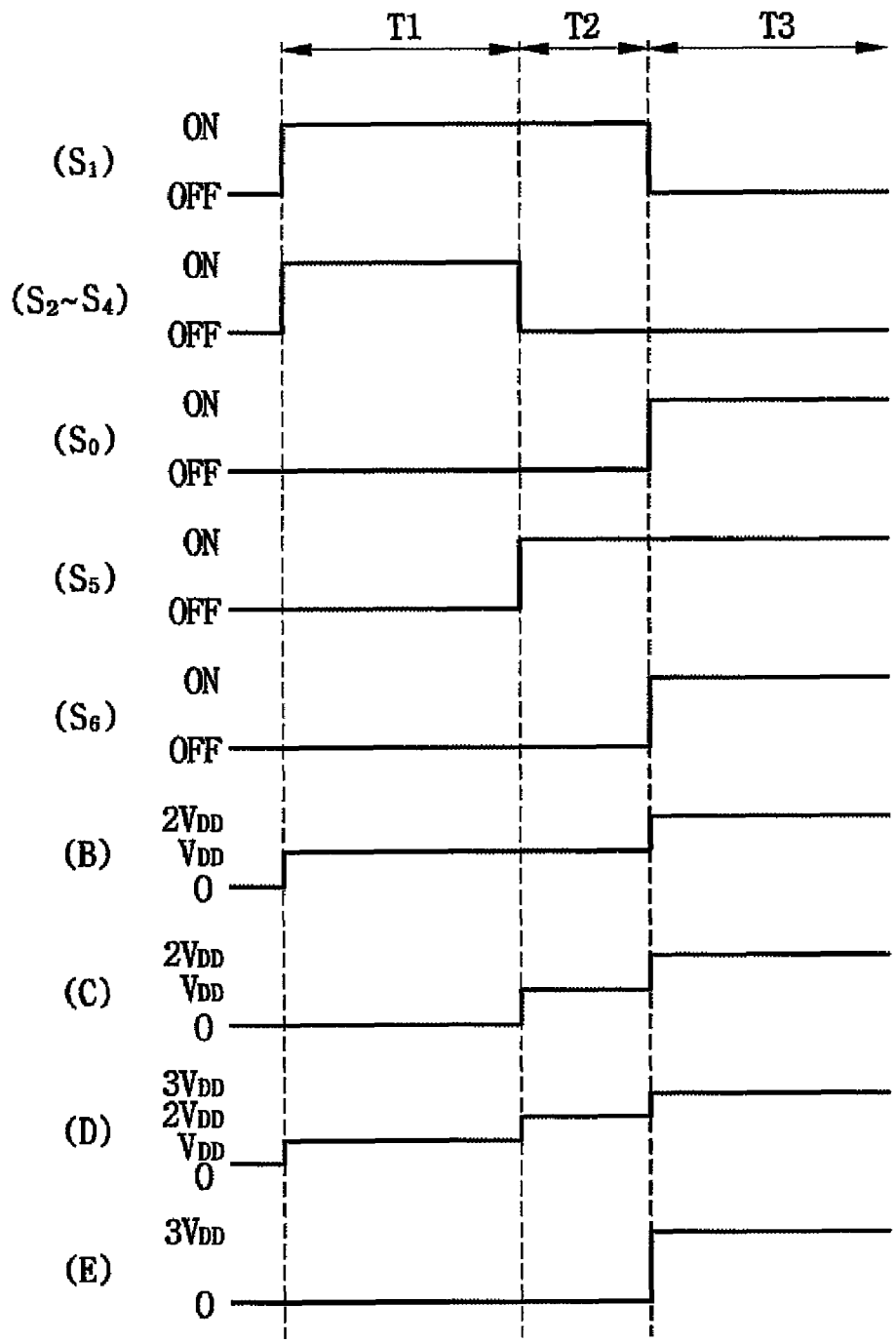
FIG. 5 is a timing diagram for explaining an operation of a charge pump having no separate parasitic capacitor charging switch according to another example embodiment.

FIG. 5 is a timing diagram for illustrating one possible operation for a charge pump having no separate parasitic capacitor charging switch according to an example embodiment of the inventive concept.

In FIG. 3, $S_0$ to $S_6$ represent ON/OFF operation timings of the power boost switch $S_0$, the first high switch $S_1$, the second low switch $S_2$, the second high switch $S_3$, the second low switch $S_4$, the first output switch $S_5$, and the second output switch $S_6$, respectively. Further, C represents a voltage change of the connection node, D represents a voltage change of the third node, and E represents a voltage change of the output node. $T_1$, $T_2$, and $T_3$ represent the pre-charge period, the parasitic capacitor charging period, and the boosting operation period, respectively.

Operation of the charge pump illustrated in FIG. 4 will be further described with reference to FIG. 5.

During the pre-charge period $T_1$, the first high switch $S_1$ and the first low switch $S_2$ are turned ON, and the power boost switch $S_0$ and the first output switch $S_5$ are turned OFF. Thus, the first MOS capacitor $C_1$ is electrically charged to the pre-charge voltage VDD applied through the first high switch $S_1$. Further, during the pre-charge period $T_1$, the second high switch $S_3$ and the second low switch $S_4$ are turned ON, and the second output switch $S_6$ is turned OFF. Thus, the second MOS capacitor $C_2$ is electrically charged to the pre-charge voltage VDD applied through the second high switch $S_3$. A voltage level of the third node D becomes the pre-charge voltage level (e.g., VDD) since the pre-charge voltage VDD is applied to the third node D through the second high switch $S_3$.

During the parasitic capacitor charging period $T_2$, the first high switch 51 and the first output switch S5 are turned ON, and the first low switch $S_2$, the second high switch $S_3$, the second low switch $S_4$, the first output switch $S_5$, the second output switch $S_6$, and the power boost switch $S_0$ are turned OFF. Thus, the parasitic capacitor Cp is electrically charged to the pre-charge voltage VDD applied through the first high switch $S_1$ and the first output switch $S_5$. A voltage level of the third node D becomes a level (e.g., 2*VDD) which is approximately twice as high as the pre-charge voltage by the pre-charge voltage VDD applied through the first high switch $S_1$ and the first output switch $S_5$ and the voltage charged in the second MOS capacitor $C_2$.

During the boosting operation period $T_3$, the power boost switch $S_0$, the first output switch $S_5$, and the second output switch $S_6$ are turned ON, and the first high switch $S_1$, the first low switch $S_2$, the second high switch $S_3$, and the second low switch $S_4$ are turned OFF. Thus, during the boosting operation period, the connection node C is boosted to the first output voltage (e.g., 2*VDD) by the pre-charge voltage VDD applied through the power boost switch $S_0$ and the voltage charged in the first MOS capacitor $C_1$. Further, the third node D and the output node E are boosted to the second output voltage (e.g., 3*VDD) by the first output voltage applied through the first output switch $S_5$ and the voltage charged in the second MOS capacitor $C_2$.

Figure 6:
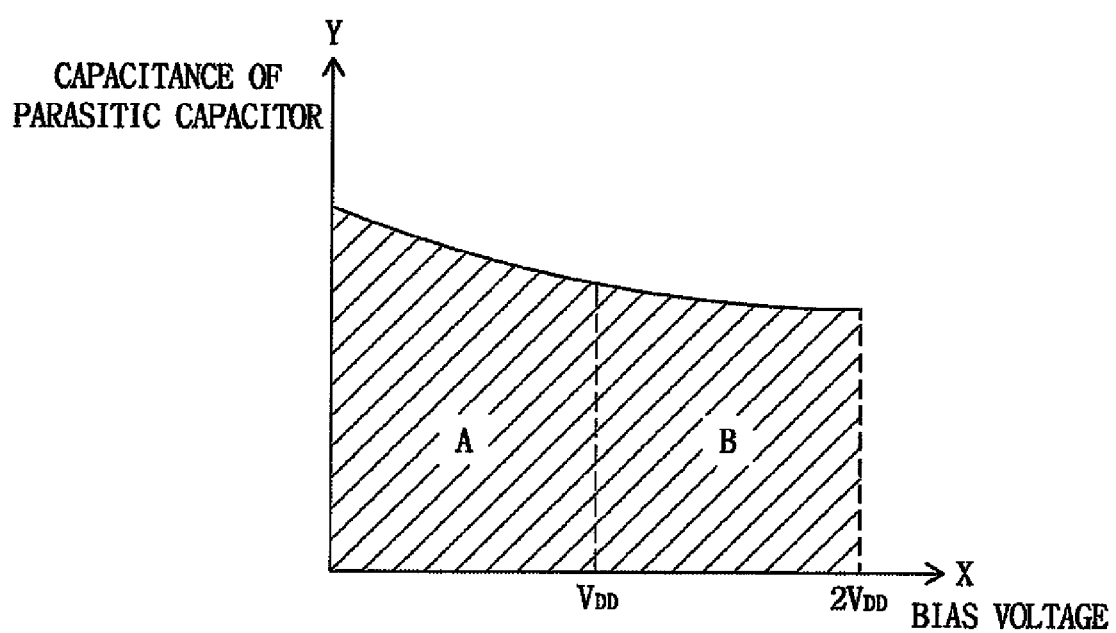
FIG. 6 is a graph illustrating a relationship between the capacitance of a parasitic capacitor and a bias voltage applied to the parasitic capacitor according to an example embodiment.

FIG. 6 is a graph illustrating a relationship between the capacitance of the parasitic capacitor and a bias voltage applied to the parasitic capacitor according to an example embodiment of the inventive concept. This relationship will be described in the context of FIGS. 2 through 6.

In an example embodiment, the parasitic capacitor Cp refers to the junction parasitic capacitor Cp between the N well 240 of the MOS capacitor connected to the connection node C and the P-type substrate 260 as described above. Thus, when the bias voltage applied to the connection node C increases, the depletion region between the N well 240 and the P-type substrate 260 increases, and the capacitance of the parasitic capacitor Cp changes non-linearly as illustrated in FIG. 6.

In FIG. 6, a vertical axis denotes the capacitance of the parasitic capacitor Cp, and a horizontal axis denotes the bias voltage applied to the parasitic capacitor Cp. In FIG. 6, a hatched region represents a charge quantity charged according to the bias voltage applied to the parasitic capacitor Cp.

That is, a charge quantity of an area A is required to electrically charge the parasitic capacitor Cp up to the pre-charge voltage $V_{DD}$, and a charge quantity of an area A+B is required to electrically charge the parasitic capacitor Cp up to a voltage ($2V_{DD}$) which is twice as high as the pre-charge voltage $V_{DD}$.

In the circuit configuration of FIG. 1, when the output voltage of the charge pump is output without the parasitic capacitor charging period electrically charging the parasitic capacitor Cp, a voltage which is approximately twice as high as the pre-charge voltage is applied to the connection node C as the bias voltage. Therefore, in order to electrically charge the parasitic capacitor Cp, the charge quantity of the area "A+B" flows into the parasitic capacitor Cp from the first capacitor $C_1$. However, when the parasitic capacitor Cp is electrically charged to the pre-charge voltage in advance before the charge pump outputs the output voltage, the charge quantity which flows into the parasitic capacitor Cp from the first capacitor $C_1$ is reduced by the charge quantity of the area A. The charge pump according to an example embodiment performs an operation of electrically charging the parasitic capacitor Cp before outputting the output voltage thereof and thereby reduces the charge quantity of the first capacitor $C_1$ which is reduced to electrically charge the parasitic capacitor Cp. That is, it is possible to prevent reduction of the output voltage/current provided by the charge pump circuit by the quantity of charge quantity in area A.

Figure 7:
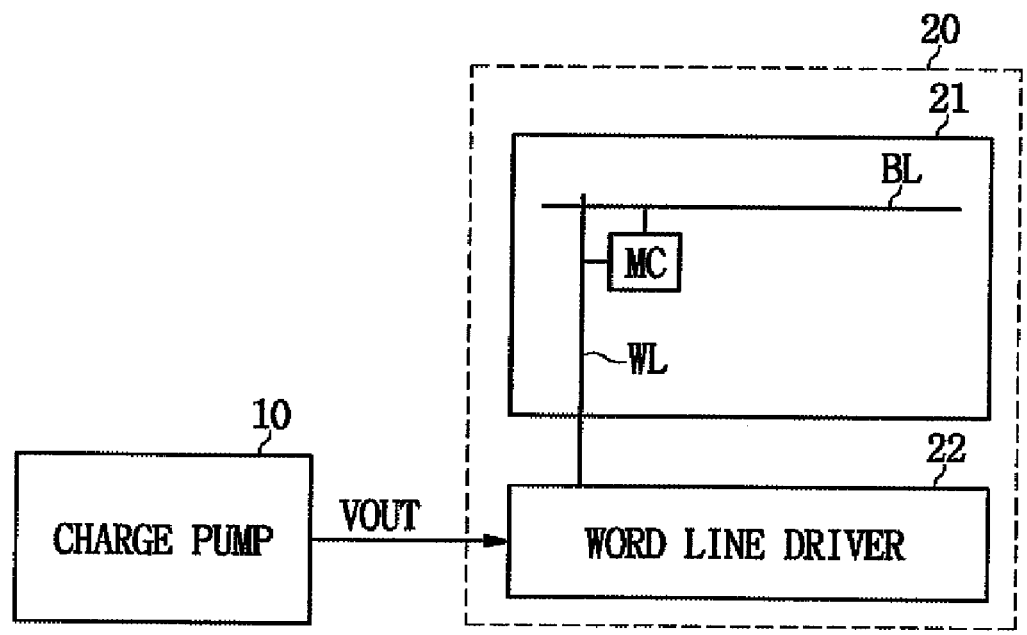
FIG. 7 illustrates a semiconductor memory device as a semiconductor device having a charge pump according to an example embodiment.

FIG. 7 illustrates a semiconductor memory device as one example of the many different semiconductor devices beneficially susceptible to the incorporation of a charge pump circuit according to an example embodiment of the inventive concept. The semiconductor device of FIG. 7 may include a charge pump 10 and a memory cell array 20. The memory cell array 20 may include a memory cell array block 21 and a word line driver 22. Functional operation of theses components will now be described.

The charge pump 10 may have the same configuration as the exemplary circuit previously described in relation to FIGS. 1 through 6, and may be configured to output a second output voltage VOUT using the pre-charge voltage VDD.

The memory cell array 20 may include a memory cell array block 21 having a memory cell MC connected between a word line WL and a bit line BL and a word line driver 22 which receives the second output voltage VOUT and drives the word line WL.

That is, in the case of the semiconductor device, the second output voltage VOUT generated by the charge pump 10 is applied to the word line driver 22, and the word line driver 22 drives the word line WL by using the second output voltage VOUT.

As described above, according to certain example embodiments, since a parasitic capacitor in a charge pump is electrically charged to a power voltage before the output voltage/current of the charge pump is provided, the conventionally occurring reduction in the output voltage/current caused by charging of the parasitic capacitor may be prevented.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this inventive concept as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A charge pump comprising:
    a first boosting unit configured to receive a pre-charge voltage and electrically charge a first MOS capacitor during a pre-charge period, and to boost a voltage of a connection node to a first output voltage during a boosting operation period; and
    a second boosting unit configured to receive the pre-charge voltage and electrically charge a second MOS capacitor during the pre-charge period, and to receive the first output voltage and boost a voltage of an output node to a second output voltage during the boosting operation period,
    wherein the pre-charge voltage is applied to a parasitic capacitor to electrically charge the parasitic capacitor during a parasitic capacitor charging period between the pre-charge period and the boosting operation period.

2. The charge pump of claim 1, wherein the first boosting unit comprises:
    the first MOS capacitor connected between a first node and a second node;
    a power boost switch connected between the pre-charge voltage and the first node and turned ON during the boosting operation period;
    a first high switch connected between the pre-charge voltage and the second node and turned ON during the pre-charge period;
    a first low switch connected between the first node and a ground voltage and turned ON during the pre-charge period; and
    a first output switch connected between the second node and the connection node and turned ON during the boosting operation period.

3. The charge pump of claim 2, wherein the first high switch and the first output switch are turned ON during the parasitic capacitor charging period to apply the pre-charge voltage to the parasitic capacitor and electrically charge the parasitic capacitor.

4. The charge pump of claim 1, wherein the second boosting unit comprises:
    the second MOS capacitor connected between the connection node and a third node;
    a second high switch connected between the pre-charge voltage and the third node and turned ON during the pre-charge period;
    a second low switch connected between the connection node and a ground voltage and turned ON during the pre-charge period; and
    a second output switch connected between the third node and the output node and turned ON during the boosting operation period.

5. The charge pump of claim 1, further comprising a parasitic capacitor charging switch connected between the pre-charge voltage and the connection node and turned ON during the parasitic capacitor charging period to apply the pre-charge voltage to the parasitic capacitor to electrically charge the parasitic capacitor.

6. The charge pump of claim 1, wherein the first output voltage is a voltage in which a voltage charged in the first MOS capacitor is added to the pre-charge voltage, and the second output voltage is a voltage in which a voltage charged in the second MOS capacitor is added to the first output voltage.

7. The charge pump of claim 1, wherein the parasitic capacitor is a junction parasitic capacitor existing between a well of the MOS capacitor and a substrate.

8. A semiconductor device, comprising:
a charge pump including:
a first boosting unit configured to receive a pre-charge voltage and electrically charge a first MOS capacitor during a pre-charge period, and to boost a voltage of a connection node to a first output voltage during a boosting operation period; and
a second boosting unit configured to receive the pre-charge voltage and electrically charge a second MOS capacitor during the pre-charge period, and to receive the first output voltage and boost a voltage of an output node to a second output voltage during the boosting operation period,
wherein the pre-charge voltage is applied to a parasitic capacitor to electrically charge the parasitic capacitor during a parasitic capacitor charging period between the pre-charge period and the boosting operation period.

9. The semiconductor device of claim 8, further comprising:
a word line driver configured to receive the second output voltage and drive a word line; and
a memory cell array including a memory cell array block having a memory cell connected between the word line and a bit line.

10. The semiconductor device of claim 8, wherein the first boosting unit comprises:
the first MOS capacitor connected between a first node and a second node;
a power boost switch connected between the pre-charge voltage and the first node and turned ON during the boosting operation period;
a first high switch connected between the pre-charge voltage and the second node and turned ON during the pre-charge period;
a first low switch connected between the first node and a ground voltage and turned ON during the pre-charge period; and
a first output switch connected between the second node and the connection node and turned ON during the boosting operation period.

11. The semiconductor device of claim 10, wherein the first high switch and the first output switch are turned ON during the parasitic capacitor charging period to apply the pre-charge voltage to the parasitic capacitor and electrically charge the parasitic capacitor.

12. The semiconductor device of claim 8, wherein the second boosting unit comprises:
the second MOS capacitor connected between the connection node and a third node;
a second high switch connected between the pre-charge voltage and the third node and turned ON during the pre-charge period;
a second low switch connected between the connection node and a ground voltage and turned ON during the pre-charge period; and
a second output switch connected between the third node and the output node and turned ON during the boosting operation period.

13. The semiconductor device of claim 8, further comprising a parasitic capacitor charging switch connected between the pre-charge voltage and the connection node and turned ON during the parasitic capacitor charging period to apply the pre-charge voltage to the parasitic capacitor to electrically charge the parasitic capacitor.

14. The semiconductor device of claim 8, wherein the first output voltage is a voltage in which a voltage charged in the first MOS capacitor is added to the pre-charge voltage, and the second output voltage is a voltage in which a voltage charged in the second MOS capacitor is added to the first output voltage.

15. The semiconductor device of claim 8, wherein the parasitic capacitor is a junction parasitic capacitor existing between a well of the MOS capacitor and a substrate.

16. A method of operating a charge pump disposed in a semiconductor device, the charge pump comprising a first boosting unit, a second boosting unit, and the method comprising:
receiving a pre-charge voltage in the first boosting unit and electrically charging a first MOS capacitor during a pre-charge period;
by operation of the first boosting unit, boosting a voltage of a connection node to a first output voltage during a boosting operation period;
receiving the pre-charge voltage in the second boosting unit and electrically charging a second MOS capacitor during the pre-charge period;
receiving in the second boosting unit the first output voltage and boosting a voltage of an output node to a second output voltage during the boosting operation period,
wherein the pre-charge voltage is applied to a parasitic capacitor to electrically charge the parasitic capacitor during a parasitic capacitor charging period between the pre-charge period and the boosting operation period.

17. The method of claim 16, wherein the first boosting unit comprises the first MOS capacitor connected between a first node and a second node, a power boost switch connected between the pre-charge voltage and the first node, a first high switch connected between the pre-charge voltage and the second node, a first low switch connected between the first node and a ground voltage, and a first output switch connected between the second node and the connection node, the method further comprising:
turning ON the power boost switch and the first output switch during the boosting operation period; and
turning ON the first high switch and the first low switch during the pre-charge period.

18. The method of claim 17, wherein the first high switch and the first output switch are turned ON during the parasitic capacitor charging period to apply the pre-charge voltage to the parasitic capacitor and electrically charge the parasitic capacitor.

19. The method of claim 16, wherein the second boosting unit comprises the second MOS capacitor connected between the connection node and a third node, a second high switch connected between the pre-charge voltage and the third node, a second low switch connected between the connection node and a ground voltage, and a second output switch connected between the third node and the output node, the method further comprising:
turning ON the second high switch and the second low switch during the pre-charge period; and
turning ON the second output switch during the boosting operation period.

20. The method of claim 16, wherein the charge pump further comprises a parasitic capacitor charging switch connected between the pre-charge voltage and the connection node, and the method further comprises:
turning ON the parasitic capacitor charging switch during the parasitic capacitor charging period to apply the pre-charge voltage to the parasitic capacitor to electrically charge the parasitic capacitor.

* * * * *